United States Patent [19]

Kawaura

[11] Patent Number: 5,181,093
[45] Date of Patent: Jan. 19, 1993

[54] SOLID STATE IMAGE SENSOR HAVING HIGH CHARGE TRANSFER EFFICIENCY

[75] Inventor: Hisao Kawaura, Tokyo, Japan

[73] Assignee: NEC Corporation, Tokyo, Japan

[21] Appl. No.: 798,136

[22] Filed: Nov. 26, 1991

[30] Foreign Application Priority Data

Nov. 26, 1990 [JP] Japan .................... 2-321913

[51] Int. Cl.$^5$ ................... H01L 29/78; G11C 19/28
[52] U.S. Cl. ...................... 257/223; 377/58; 257/233
[58] Field of Search .............. 357/24; 377/57–63

[56] References Cited

U.S. PATENT DOCUMENTS 5,043,783  8/1991  Matsumoto et al. ........... 357/24 LR
5,049,960  9/1991  Miwada ..................... 357/24 LR

*Primary Examiner*—Gene M. Munson
*Attorney, Agent, or Firm*—Sughrue, Mion, Zinn, Macpeak & Seas

[57] ABSTRACT

A solid state image sensor comprises a p-type semiconductor region, an n-type photoelectric conversion region formed in a surface region of the semiconductor region, an n-type charge transfer region formed in the surface of the semiconductor region separately from the photoelectric conversion region, and an electric charge read-out gate region formed between the photoelectric conversion region and the charge transfer region. A p+ thin surface layer region if formed to cover a surface of the photoelectric conversion region excluding an end portion adjacent to the electric charge read-out gate region. A gate electrode is formed above the electric charge read-out gate region. The end portion of the photoelectric conversion region not covered by the thin surface layer region, has a short length sufficient to make a potential well formed in the portion shallow under influence of potentials of the p+ thin surface layer region and the electric charge read-out gate region. Preferably, this end portion of the photoelectric conversion region is formed of a surface region having a low impurity concentration.

2 Claims, 2 Drawing Sheets

SOLID STATE IMAGE SENSOR HAVING HIGH CHARGE TRANSFER EFFICIENCY

BACKGROUND OF THE INVENTION

1. Field of the Invention

The present invention relates to a solid state image sensor, and more specifically to a solid state image sensor having a photoelectric converting element constituted of a buried photodiode.

2. Description of Related Art

A typical solid state image sensor is such that a signal electric charge accumulated in a photoelectric conversion region is transferred to a charge transfer region through a gate region. However, the conventional solid state image sensor has a disadvantage in which a portion of the signal charge to be read from the photoelectric conversion region still remains in the photoelectric conversion region. This means that, at the time of the signal charge reading, all of the signal charge cannot be read out or transferred from the photoelectric conversion region to the charge transfer region, and therefore, an afterimage occurs.

SUMMARY OF THE INVENTION

Accordingly, it is an object of the present invention to provide a solid state image sensor which has overcome the above mentioned defect of the conventional one.

Another object of the present invention is to provide a solid state image sensor having a high charge transfer efficiency so that few afterimage occurs.

The above and other objects of the present invention are achieved in accordance with the present invention by a solid state image sensor comprising a semiconductor region of a first conduction type, a photoelectric conversion region of a second conduction type formed in a surface region of the semiconductor region, a charge transfer region of the second conduction type formed in the surface region of the semiconductor region and separated from the photoelectric conversion region, an electric charge read-out gate region formed between the photoelectric conversion region and the charge transfer region, a thin surface layer region of the first conduction type having a high impurity concentration and formed to cover a surface of the photoelectric conversion region excluding an end portion adjacent to the electric charge read-out gate region, and a gate electrode formed above the electric charge read-out gate region and extending to partially overlap the photoelectric conversion region, the gate electrode being electrically isolated from the electric charge read-out gate region and the photoelectric conversion region, the end portion of the photoelectric conversion region which is adjacent to the electric charge read-out gate region and which is not covered by the high concentration thin surface layer region, having a short length sufficient to make a potential well formed in the end portion shallow under influence of potentials of the high concentration thin surface layer region and the electric charge read-out gate region.

Preferably, the high concentration thin surface layer region extends onto a portion of the photoelectric conversion region which is positioned directly under the gate electrode, but does not contact with the electric charge read-out gate region. The length of the end portion of the photoelectric conversion region which is adjacent to the electric charge read-out gate region and which is not covered by the high concentration thin surface layer region, is determined to ensure that the potential well formed by a voltage applied to the gate electrode becomes shallow because of a short channel effect between the high concentration surface layer region and the electric charge read-out gate region.

In a preferred embodiment, the end portion of the photoelectric conversion region which is adjacent to the electric charge read-out gate region and which is not covered by the high concentration thin surface layer region, is formed of a low impurity concentration surface region. The low impurity concentration surface region is doped with impurities of the first conduction type of the amount sufficient to substantially cancel the impurity concentration of the second conduction type of the photoelectric conversion region.

The above and other objects, features and advantages of the present invention will be apparent from the following description of preferred embodiments of the invention with reference to the accompanying drawings.

DESCRIPTION OF THE PREFERRED EMBODIMENTS

Figure 1A:
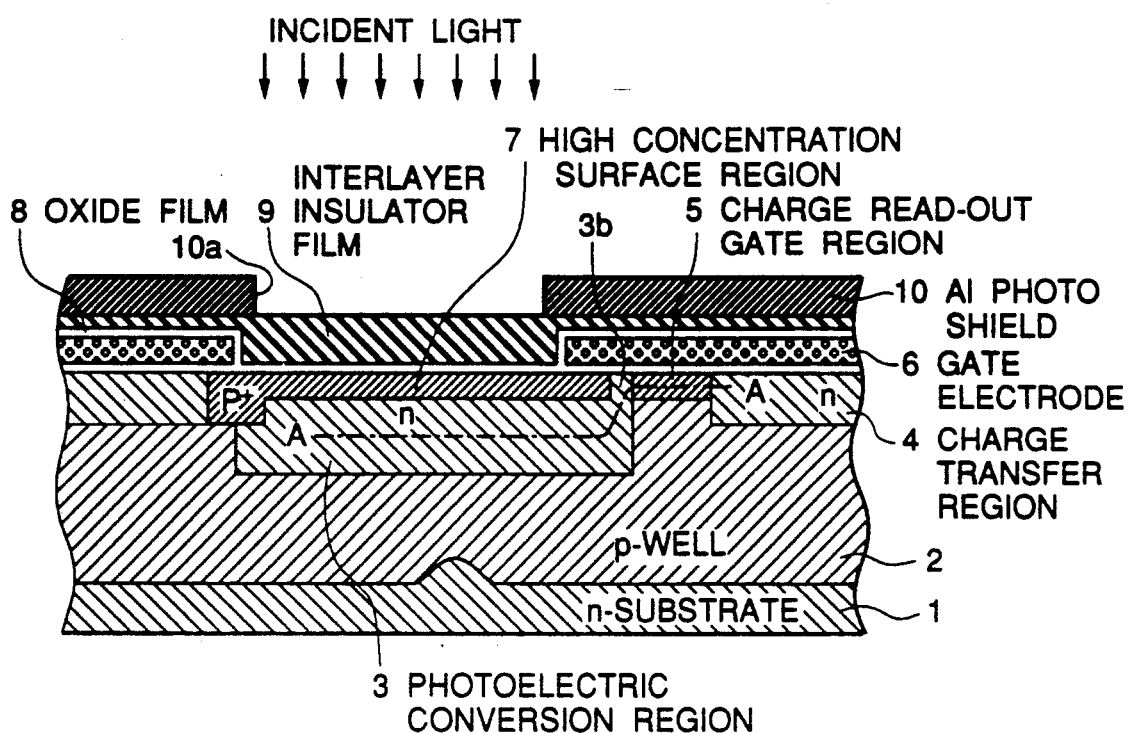
FIG. 1A is a partial and diagrammatic sectional view of a first embodiment of the solid state image sensor in accordance with the present invention.

Referring to FIG. 1A, there is shown a partial and diagrammatic sectional view of a first embodiment of the solid state image sensor in accordance with the present invention.

The shown solid state image sensor has an n-type substrate 1 such as an n-type silicon substrate and a p-type well formed on the substrate 1. Within a surface region of the p-type well 2, there are formed an n-type photoelectric conversion region 3 for converting incident light into an electric charge and accumulating the generated electric charge, and an n-type charge transfer region 4 formed separately from the photoelectric conversion region 3 for receiving the accumulated electric charge from the photoelectric conversion region 3 and transferring the received electric charge to an output section (not shown). An electric charge read-out gate region 5 is formed between the photoelectric conversion region 3 and the charge transfer region 4 for controlling a read-out of the accumulated electric charge from the photoelectric conversion region 3 to the charge transfer region 4. A gate electrode 6 is formed to extend above the electric charge read-out gate region 5 and the charge transfer region 4 and also to partially cover an end portion of the photoelectric conversion region 3. This gate electrode 6 functions as an electric charge read-out gate electrode and as an electric charge transfer electrode. The gate electrode 6 is formed of for example polysilicon.

An oxide film 8 is formed on an upper surface of the substrate and the gate electrode 6, so that the gate electrode 6 is electrically isolated from the underlying layers such as the photoelectric conversion region 3, the electric charge read-out gate region 5 and the charge transfer region 4, and also from an overlying layer.

In order to suppress a dark current generated at a boundary between the silicon and the oxide film 8, at a surface of the photoelectric conversion region 3 there is formed a p+ thin surface layer region 7 which has a high impurity concentration and which extends under the gate electrode 6 but does not reach the electric charge read-out gate region 5. In other words, the length of an end portion 3b of the photoelectric conversion region 3 not covered by the high concentration surface layer region 7 (between the high concentration surface layer region 7 and the electric charge read-out gate region 5) is remarkable short. With existence of this p+ thin surface layer region 7, the photoelectric conversion region 3 is brought into a buried type.

In addition, a transparent interlayer insulator film 9 is formed to cover the gate electrode 6 and the p+ thin surface layer region 7, and an aluminum photo shield film 10 is formed on the interlayer insulator film 9 and to have an opening 10a in alignment with the photoelectric conversion region 3.

With the above mentioned structure, a photodiode is constituted of the p-type well 2 and the n-type photoelectric conversion region 3.

Now, assuming that a reading pulse is applied to the gate electrode 6, a signal electric charge accumulated in the photoelectric conversion region 3 is read out, namely, transferred through the electric charge read-out gate region 5 to the charge transfer region 4.

Figure 1B:
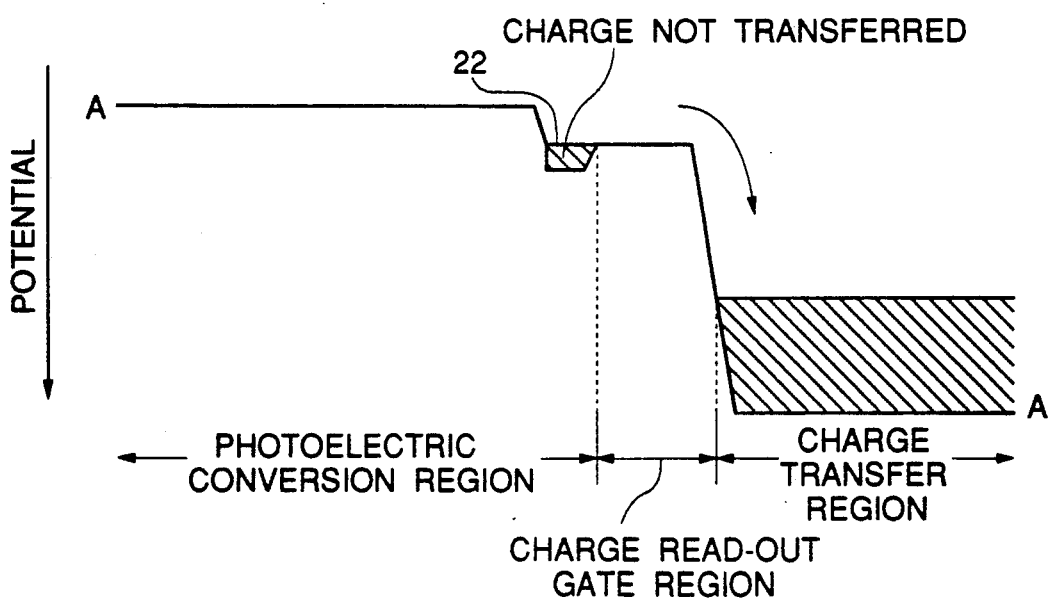
FIG. 1B is a potential diagram along the chain line A—A in FIG. 1A.

Referring to FIG. 1B, there is illustrated a potential diagram along the chain line A—A in FIG. 1A showing a charge transfer path when a signal electric charge read-out pulse is applied to the gate electrode 6. Here, examining a region of the photoelectric conversion region 3 directly underneath the gate electrode 6, although the signal electric charge read-out voltage is applied to the gate electrode 6, a potential well becomes hard to deepen in a portion of the photoelectric conversion region 3 positioned under the high concentration surface layer region 7. On the other hand, in a portion of the photoelectric conversion region 3 not covered by high concentration surface layer region 7, a potential well 22 is formed by the voltage applied to the gate electrode 6, but becomes shallow by the depth corresponding to a short channel effect between the high concentration surface layer region 7 and the electric charge read-out gate region 5.

As mentioned above, the potential well 22 formed by the voltage applied to the gate electrode 6 becomes shallow in depth and short in length, and therefore, the amount of signal charge trapped in the potential well 22 formed by the gate electrode voltage is remarkably reduced.

In order to ensure that the potential well 22 formed by the gate electrode voltage becomes shallow in depth and short in length because of the short channel effect, the length of the end portion 3b of the photoelectric conversion region 3 not covered by the high concentration surface layer region 7 is preferably in the range of from 0.1 μm to 0.2 μm inclusive.

Figure 2A:
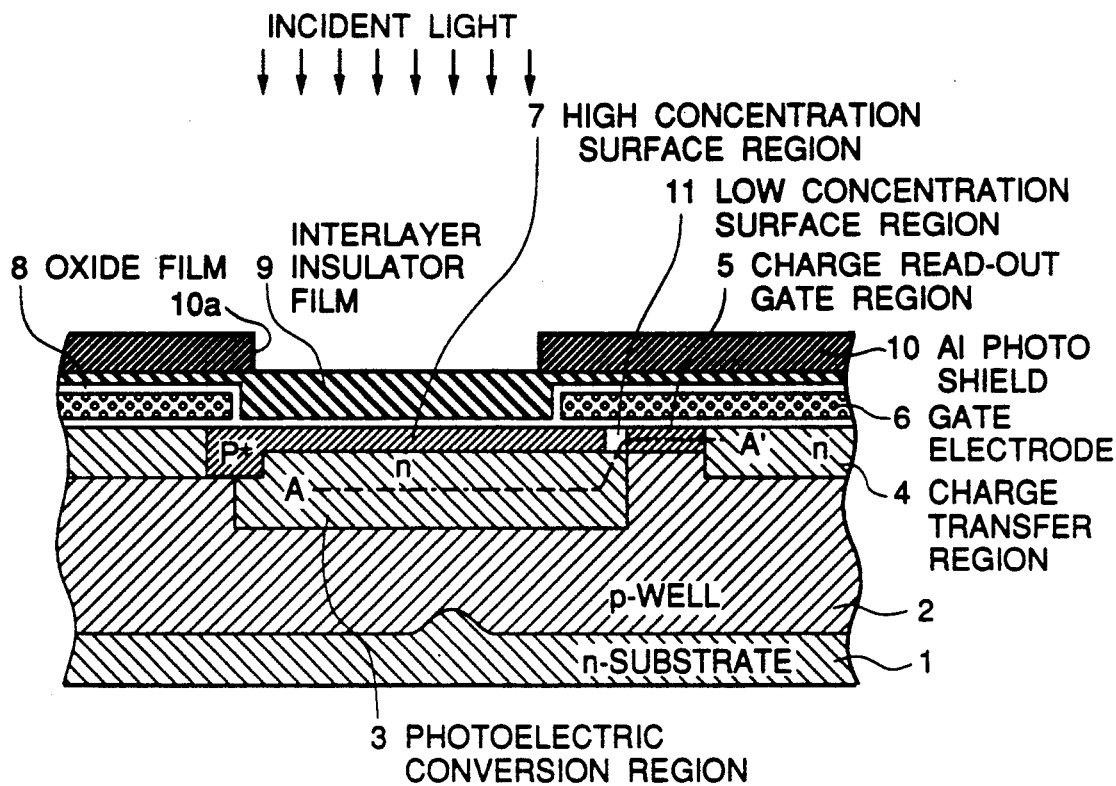
FIG. 2A is a partial and diagrammatic sectional view of a second embodiment of the solid state image sensor in accordance with the present invention.

Referring to FIG. 2A, there is shown a modification of the embodiment shown in FIG. 1A. Therefore, elements similar to those shown in FIG. 1A are given the same Reference Numerals, and explanation thereof will be omitted.

The modification shown in FIG. 2A is different from the embodiment shown in FIG. 1A, in that boron ions are implanted in a region of the photoelectric conversion region 3 between the high concentration surface layer region 7 and the electric charge read-out gate region 5, so that a low impurity concentration surface region 11 is formed. The amount of implanted borons is determined to substantially cancel the impurity concentration of the n-type impurity in the photoelectric conversion region 3.

Figure 2B:
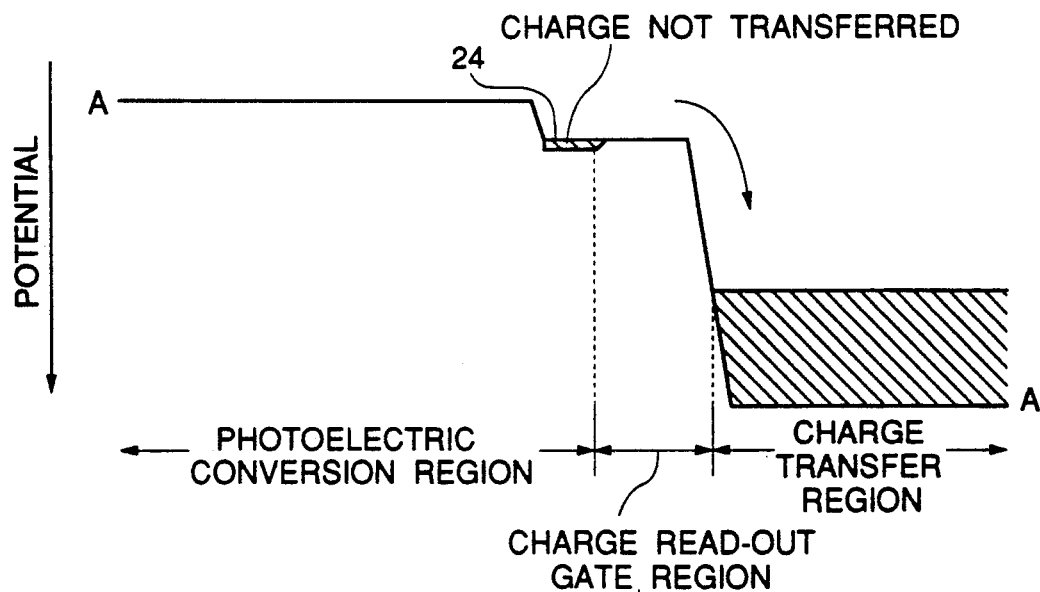
FIG. 2B is a potential diagram along the chain line A—A in FIG. 2A.

Referring to FIG. 2B, there is illustrated a potential diagram along the chain line A—A in FIG. 2A showing a charge transfer path when a signal electric charge read-out pulse is applied to the gate electrode 6. It would be apparent from FIG. 2B, a potential well 24 formed by the voltage applied to the gate electrode 6 becomes shallower in depth than the embodiment shown in FIG. 1A, and therefore, the amount of signal charge trapped in the potential well formed by the gate electrode voltage becomes smaller than the embodiment shown in FIG. 1A. This is because the low impurity concentration surface region 11 is formed at a surface region of the photoelectric conversion region 3.

As seen from the above, the solid state image sensor in accordance with the present invention is characterized in that the high impurity concentration surface layer region formed for bringing the photoelectric conversion region into the buried type is caused to extend directly under the gate electrode, so that the potential well formed in the surface portion not covered by the high impurity concentration surface region is shortened, and also shallowed by the short channel effect. Accordingly, the amount of electric charge remaining in the photoelectric conversion region at the charge reading time, is remarkably reduced, and therefore, the afterimage effect can be made small. In addition, since the length of the portion of the photoelectric conversion region in direct contact with the oxide film is shortened, the dark current can be also reduced.

The invention has thus been shown and described with reference to the specific embodiments. However, it should be noted that the present invention is in no way limited to the details of the illustrated structures but changes and modifications may be made within the scope of the appended claims.

I claim:

1. A solid state image sensor comprising a semiconductor region of a first conduction type, a photoelectric conversion region of a second conduction type formed in a surface region of said semiconductor region, a charge transfer region of the second conduction type formed in the surface region of said semiconductor region and separated from said photoelectric conversion region, an electric charge read-out gate region formed between said photoelectric conversion region and said charge transfer region, a thin surface layer region of the first conduction type having a high impurity concentration and formed to cover a surface of said photoelectric conversion region excluding an end portion adjacent to said electric charge read-out gate region, and a gate electrode formed above said electric charge read-out gate region and extending to partially overlap said photoelectric conversion region, said gate electrode being electrically isolated from said electric charge read-out gate region and said photoelectric conversion region, said end portion of said photoelectric conversion region which is adjacent to said electric charge read-out gate region and which is not covered by said high concentration thin surface layer region, having a short length sufficient to make a potential well formed in said end portion shallow under influence of potentials of said high concentration thin surface layer region and said electric charge read-out gate region;

wherein said end portion of said photoelectric conversion region which is adjacent to said electric charge read-out gate region and which is not covered by said high concentration thin surface layer region, is formed of a low impurity concentration surface region; and wherein said low impurity concentration surface region is doped with impurities of the first conduction type of the amount sufficient to substantially cancel the impurity concentration of the second conduction type of said photoelectric conversion region.

2. A solid state image sensor comprising a semiconductor region of a first conduction type, a photoelectric conversion region of a second conduction type formed in a surface region of said semiconductor region, a charge transfer region of the second conduction type formed in the surface region of said semiconductor region and separated from said photoelectric conversion region, an electric charge read-out gate region formed between said photoelectric conversion region and said charge transfer region, a gate electrode formed above said electric charge read-out gate region and extending to partially overlap said photoelectric conversion region, said gate electrode being electrically isolated from said electric charge read-out gate region and said photoelectric conversion region, and a thin surface layer region of the first conduction type having a high impurity concentration and formed to cover a surface of said photoelectric conversion region not covered under said gate electrode, said high concentration thin surface layer region extending onto a portion of said photoelectric conversion region which is positioned directly under said gate electrode, and terminating without contact with said electric charge read-out gate region so that said photoelectric conversion region has an end portion which is adjacent to said electric charge read-out gate region and which is not covered by said high concentration thin surface layer region, said end portion having a short length sufficient to ensure that a potential well formed by a voltage applied to said gate electrode becomes shallow because of a short channel effect between said high concentration surface layer region and said electric charge read-out gate region, and said end portion being formed of a low impurity concentration surface region;

wherein said low impurity concentration surface region is doped with impurities of the first conduction type of the amount sufficient to substantially cancel the impurity concentration of the second conduction type of said photoelectric conversion region.

* * * * *